(12) United States Patent
Imaoka et al.

(10) Patent No.: US 9,761,479 B2
(45) Date of Patent: Sep. 12, 2017

(54) MANUFACTURING METHOD FOR SEMICONDUCTOR SUBSTRATE

(71) Applicants: KABUSHIKI KAISHA TOYOTA JIDOSHOKKI, Kariya-shi, Aichi (JP); SICOXS CORPORATION, Tokyo (JP); NATIONAL INSTITUTE OF ADVANCED INDUSTRIAL SCIENCE AND TECHNOLOGY, Tokyo (JP)

(72) Inventors: Ko Imaoka, Kariya (JP); Motoki Kobayashi, Tokyo (JP); Hidetsugu Uchida, Tokyo (JP); Kuniaki Yagi, Tokyo (JP); Takamitsu Kawahara, Tokyo (JP); Naoki Hatta, Tokyo (JP); Akiyuki Minami, Tokyo (JP); Toyokazu Sakata, Tokyo (JP); Tomoatsu Makino, Tokyo (JP); Hideki Takagi, Tsukuba (JP); Yuuichi Kurashima, Tsukuba (JP)

(73) Assignees: KABUSHIKI KAISHA TOYOTA JIDOSHOKKI, Aichi (JP); SICOXS CORPORATION, Tokyo (JP); NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

(21) Appl. No.: 14/902,764

(22) PCT Filed: Jul. 3, 2014

(86) PCT No.: PCT/JP2014/067777
§ 371 (c)(1),
(2) Date: Jan. 4, 2016

(87) PCT Pub. No.: WO2015/002266
PCT Pub. Date: Jan. 8, 2015

(65) Prior Publication Data
US 2016/0204023 A1 Jul. 14, 2016

(30) Foreign Application Priority Data
Jul. 5, 2013 (JP) ................. 2013-142151

(51) Int. Cl.
*H01L 21/30* (2006.01)
*H01L 21/46* (2006.01)
(Continued)

(52) U.S. Cl.
CPC .... *H01L 21/76251* (2013.01); *H01L 21/2007* (2013.01); *H01L 29/1608* (2013.01)

(58) Field of Classification Search
CPC ......... H01L 21/76; H01L 21/02; H01L 29/16; H01L 21/20; H01L 21/30; H01L 21/46
(Continued)

(56) References Cited

U.S. PATENT DOCUMENTS 5,298,449 A * 3/1994 Kikuchi .............. H01L 21/3226
148/DIG. 12
5,374,564 A * 12/1994 Bruel ..................... B28D 1/005
148/DIG. 12
(Continued)

FOREIGN PATENT DOCUMENTS

JP 10-92702 A 4/1998
JP 2000-091176 A 3/2000
(Continued)

OTHER PUBLICATIONS

English (Machine) translation of Foreign Patent: JP2009-117533 A.*
(Continued)

*Primary Examiner* — Sheikh Maruf
(74) *Attorney, Agent, or Firm* — Sughrue Mion, PLLC

(57) ABSTRACT

A technique disclosed herein relates to a manufacturing method for a semiconductor substrate having the bonded
(Continued)

interface with high bonding strength without forming an oxide layer at the bonded interface also for the substrate having surface that is hardly planarized. The manufacturing method for the semiconductor substrate may include an amorphous layer formation process in which a first amorphous layer is formed by modifying a surface of a support substrate and a second amorphous layer is formed by modifying a surface of a single-crystalline layer of a semiconductor. The manufacturing method may include a contact process in which the first amorphous layer and the second amorphous layer are contacted with each other. The manufacturing method may include a heat treatment process in which the support substrate and single-crystalline layer are heat-treated with the first amorphous layer and the second amorphous layer being in contact with each other.

16 Claims, 9 Drawing Sheets

(51) Int. Cl.
  *H01L 21/76* (2006.01)
  *H01L 21/762* (2006.01)
  *H01L 21/20* (2006.01)
  *H01L 29/16* (2006.01)

(58) Field of Classification Search
  USPC ............ 438/455, 46, 506, 459, 47, 458;
  257/E21.567, E21.568
  See application file for complete search history.

(56) References Cited

U.S. PATENT DOCUMENTS

| | | | | |
|---|---|---|---|---|
| 6,048,411 | A * | 4/2000 | Henley | B81C 1/0038 148/33.5 |
| 6,251,754 | B1 * | 6/2001 | Ohshima | H01L 21/76254 257/E21.568 |
| 2001/0019877 | A1 * | 9/2001 | Miyake | C30B 19/00 438/481 |
| 2002/0096106 | A1 * | 7/2002 | Kub | H01L 21/2007 117/94 |
| 2003/0008475 | A1 * | 1/2003 | Cheung | H01L 21/76251 438/455 |
| 2003/0008477 | A1 * | 1/2003 | Kang | H01L 21/304 438/458 |
| 2003/0129780 | A1 * | 7/2003 | Auberton-Herve | H01L 21/76254 438/46 |
| 2003/0219959 | A1 * | 11/2003 | Ghyselen | H01L 21/3148 438/458 |
| 2005/0081958 | A1 * | 4/2005 | Adachi | H01L 21/76251 148/33.1 |
| 2005/0194864 | A1 * | 9/2005 | Miura | H03H 9/02559 310/313 R |
| 2005/0215028 | A1 * | 9/2005 | Wei | C03C 27/042 438/455 |
| 2006/0177993 | A1 * | 8/2006 | Endo | H01L 21/76254 438/458 |
| 2006/0264004 | A1 * | 11/2006 | Tong | H01L 21/76254 438/455 |
| 2009/0298258 | A1 * | 12/2009 | de Souza | H01L 21/76251 438/455 |
| 2010/0087047 | A1 * | 4/2010 | Shimomura | H01L 21/76254 438/459 |
| 2011/0192343 | A1 * | 8/2011 | Abir | H01L 21/76254 117/106 |
| 2011/0201177 | A1 * | 8/2011 | Fournel | H01L 21/76254 438/458 |
| 2013/0084442 | A1 * | 4/2013 | Akutagawa | C09D 127/20 428/212 |
| 2014/0322478 | A1 * | 10/2014 | Mori | H01L 51/5246 428/76 |
| 2015/0132923 | A1 * | 5/2015 | Gaudin | H01L 21/76251 438/459 |
| 2015/0155299 | A1 * | 6/2015 | Kitada | H01L 29/78603 428/448 |

FOREIGN PATENT DOCUMENTS

| | | | |
|---|---|---|---|
| JP | 2000091176 A | * | 3/2000 |
| JP | 2004-503942 A | | 2/2004 |
| JP | 2005-252550 A | | 9/2005 |
| JP | 2009-117533 A | | 5/2009 |
| JP | 2009117533 A | * | 5/2009 |
| JP | 2010-541230 A | | 12/2010 |
| WO | 2009/040337 A1 | | 4/2009 |

OTHER PUBLICATIONS

English (Machine) translation of Foreign Patent: JP2000-091176 A.*
Q. Y. Tong et al., "Hydrophobic silicon wafer bonding," Applied Physics Letters, Jan. 31, 1994, pp. 625-627, vol. 64, No. 5.
International Search Report of PCT/JP2014/067777 dated Aug. 26, 2014.
International Preliminary Examination Report of PCT/JP2014/067777 dated Jul. 15, 2015.
Written Opinion of the International Searching Authority for International Application No. PCT/JP2014/067777.
International Preliminary Report on Patentability for International Application No. PCT/JP2014/067777.
European Search Report dated Feb. 15, 2017 issued by the European Patent Office in corresponding application No. 14820214.6.
Hideki Takagi et al, "Transmission Electron Microscope Observations of Si/Si Interface Bonded at Room Temperature by Ar Beam Surface Activation", Japanese Journal of Applied Physics, Part 1 (Regular Papers, Short Notes & Review Papers), vol. 38, No. 3A, Mar. 1, 1999 (Mar. 1, 1999), pp. 1589-1594.
Essig S et al., "Fast atom beam-activated n-Si/n-GaAs wafer bonding with high interfacial transparency and electrical conductivity" , Journal of Applied Physics, American Institute of Physics, US, vol. 113, No. 20, May 28, 2013(May 28, 2013), pp. 203512-203512.

* cited by examiner

MANUFACTURING METHOD FOR SEMICONDUCTOR SUBSTRATE

CROSS REFERENCE TO RELATED APPLICATIONS

This application is a National Stage of PCT/JP2014/067777 filed Jul. 3, 2014, and claims the priority of Japanese Patent Application No. 2013-142151 filed on Jul. 5, 2013. The content thereof is incorporated herein by reference in its entirety. This specification discloses a technique relating to a manufacturing method for a semiconductor substrate having a bonded interface with high bonding strength.

TECHNICAL FIELD

Background Art

As a candidate for the substrate material of the next power device, silicon carbide (hereinafter referred to as SiC) is suggested. However, the manufacturing cost of the substrate itself is expensive, which has been an obstacle to practical application. Meanwhile, if only a device formation layer part uses high quality single-crystalline SiC, and this part can be fixed to a support substrate (a material which is strong, heat-resistant, and clean, e.g., Poly-SiC, which withstands device manufacturing processes) in some way, it is possible to form a base material meeting both low cost (support substrate part) and high quality (SiC part). As an existing technique applicable in order to realize the foregoing structure, substrate bonding is known. Substrate bonding is used as a technique for forming a semiconductor integrated circuit or a technique for forming MEMS, and is used to bond, mainly silicon substrates together, or to bond a silicon substrate and a substrate of different material. This substrate bonding falls roughly into "indirect bonding" in which a different material such as adhesive or metal is interposed and "direct bonding" in which they are not interposed. However, for a substrate used as a semiconductor device material, it is preferable to use "direct bonding" in order to avoid the influence of contamination by adhesive, metal, etc. A technique related to direct bonding is disclosed in, for example, the one given below. JP 2009-117533 A discloses a manufacturing method for a bonded substrate, in which after a plasma activation process is performed on the SiC substrate surfaces to be bonded, these substrate surfaces are brought into contact with each other, and then they are subjected to heat treatment, thus bonded together. In this case, since the substrate surfaces before their contact are hydrophilic, an oxide layer resulting from introduced water is formed at the bonded interface after bond formation. Meanwhile, Applied Physics Letters, Vol. 64, No. 5, 31 1994 reports a substrate bonding method, in which after Si substrate surfaces to be bonded are subjected to a hydrophobic treatment using a diluted hydrogen fluoride solution, the substrate surfaces are brought into contact with each other, and then they are subjected to heat treatment, thus bonded together. In this case, since there is no water at the bonded interface, a bonded substrate can be obtained without oxide layer formation at the bonded interface.

SUMMARY OF INVENTION

Technical Problem

However, forming a bonded substrate using a manufacturing method according to the JP 2009-117533 A has problems that, in the application of a vertical power semiconductor device, electrical resistance in the vertical direction of the substrate increases due to an oxide layer formed at the bonded interface. Additionally, it also has a problem that an interface structure is, for example, unstable in relation to a heating treatment temperature (>1200 degrees Celsius) in a SiC device formation process. Meanwhile, when a bonded substrate is formed using a substrate bonding method according to the Applied Physics Letters, Vol. 64, No. 5, 31 1994, substrate surfaces to be bonded are required to be rendered hydrophobic. However, since SiC is a compound semiconductor, the charged states of the substrate surfaces differ depending on the types of atoms exposed on the substrate surfaces, unlike Si, which is composed of a single element. Therefore, in the method used in the Applied Physics Letters, Vol. 64, No. 5, 31 1994, it is difficult to obtain uniform hydrophobicity in a wide range of each substrate surface. Additionally, in direct bonding, unlike indirect bonding in which an intermediate layer is interposed bonding, the shape (roughness) of substrate surfaces to be bonded directly affects an effective bonded area. Therefore, there is a limitation that the surface roughness of surfaces to be bonded has to be extremely slight. However, the surface planarization of the SiC substrate is less than that of a Si substrate due to the influence of the defects of crystals contained in the substrates, in addition to the non-uniformly charged states of the substrate surfaces described above. As a result, the effective bonded area decreases, making it difficult to obtain bonding strength that withstands semiconductor processing.

Solution to Problem

A manufacturing method for a semiconductor substrate is disclosed in the present specification. The manufacturing method for a semiconductor substrate comprises an amorphous layer formation process in which a first amorphous layer is formed by modifying a surface of a support substrate and a second amorphous layer is formed by modifying a surface of a single-crystalline layer of a semiconductor. The manufacturing method comprises a contact process in which the first amorphous layer and second amorphous layer are brought into contact with each other. The manufacturing method comprises a heat treatment process in which the support substrate and single-crystalline layer are heat-treated with the first amorphous layer and the second amorphous layer being in contact with each other.

In the foregoing method, the first amorphous layer can be formed on the surface of the support substrate and a second amorphous layer can be formed on the surface of the single-crystalline layer by the amorphous layer formation process. Each of the amorphous layers is a layer in which atoms have no regularity, unlike a crystalline structure. The first amorphous layer and second amorphous layer can be recrystallized by carrying out the heat treatment process with the first and second amorphous layers being in contact with each other. Since the first and second amorphous layers are integrally recrystallized, the support substrate and single-crystalline layer can be firmly bonded by covalent bonding. Thus, the discontinuity of the bonded interface between the support substrate and single-crystalline layer can be eliminated without forming an oxide layer at the bonded interface.

A method, for example, a direct bonding method uses attracting force between the substrate surfaces, such as interatomic force; therefore, atoms to be bonded have to be brought as close as not more than several nm between them, which may require the surface roughness of the surfaces to be bonded, to be very small. Meanwhile, in the foregoing method, the surfaces to be bonded are modified to become amorphous layers. In the amorphous layers, atoms with dangling bonds are present. Therefore, the atoms are more fluid than those in a crystal layer in which no dangling bonds are present. Thus, after atoms forming the amorphous layers flow and fill spaces between the contact surfaces of the first and second amorphous layers, these amorphous layers can be recrystallized. That is, in the foregoing method, bonding does not require attracting force between the surfaces; therefore, even in a case where the surfaces to be bonded are rougher than those required in the direct bonding method, bonding strength sufficient to withstand semiconductor processing and so on can be obtained.

Advantageous Effects of Invention

The technique disclosed herein makes it possible to provide a manufacturing method for a semiconductor substrate having bonded interface with high bonding strength, without forming an oxide layer at the bonded interface even on a substrate with the surface of which is difficult to planarize.

DESCRIPTION OF EMBODIMENTS

Figure 1:
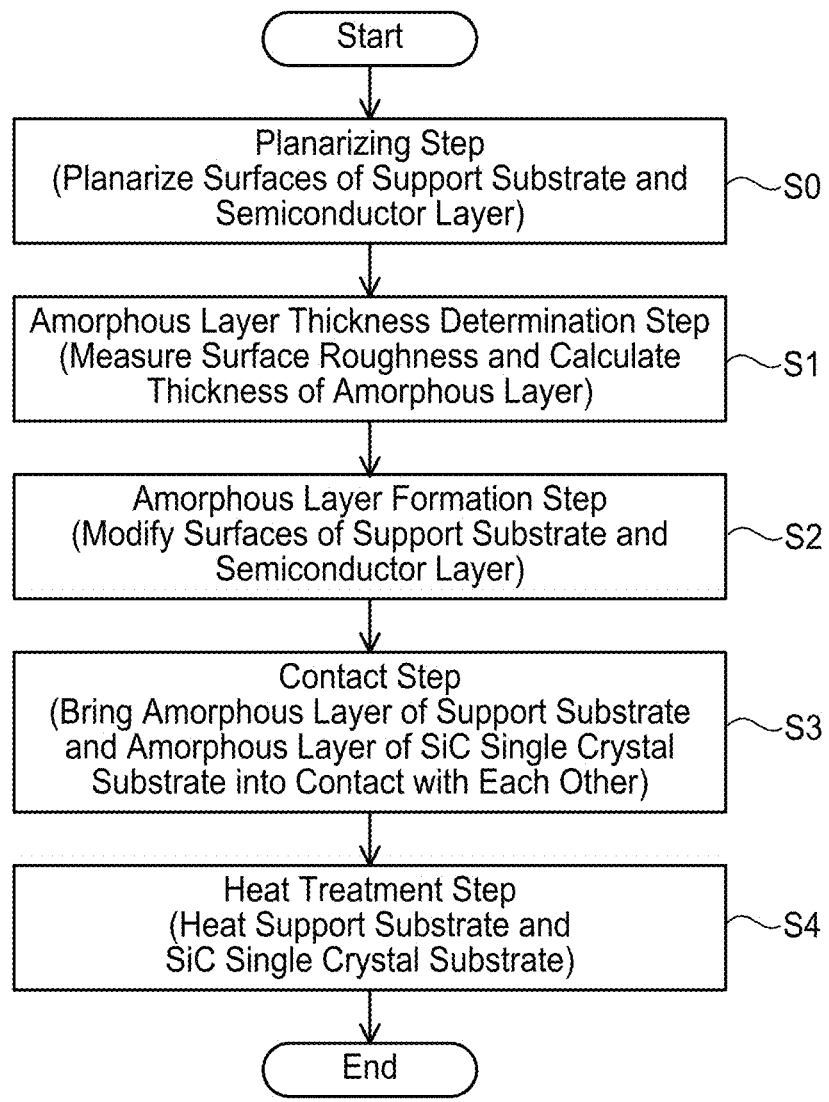
FIG. 1 is a flowchart of a manufacturing method for a bonded substrate.

Some of the technical features of an embodiment disclosed herein will now be described. The items described below have technical utility independently.

(Feature 1) In the manufacturing method for a semiconductor substrate described above, the single-crystalline layer may be formed from single-crystalline SiC, and the support substrate may be formed from polycrystalline SiC. Polycrystalline SiC is less expensive than single-crystalline SiC. Therefore, it is possible to manufacture a SiC substrate lower in manufacturing cost than a substrate formed from single-crystalline SiC only.

(Feature 2) The first amorphous layer and the second amorphous layer contain Si and C. Thus, if the composition ratio is, for example, about 1:1, SiC crystals can be formed when the first and second amorphous layers are recrystallized.

(Feature 3) In the manufacturing method for a semiconductor substrate described above, the amorphous layer formation process may include irradiating atomic-level particles in a vacuum. The contact process may be carried out subsequent to the amorphous layer formation process. By irradiating atomic level particles in a vacuum, an oxide layer and an adsorption layer, which are present in the surface of the support substrate and the surface of the single-crystalline layer of the semiconductor, can be removed. By carrying out a contact process in a vacuum, surfaces rendered clean by removal therefrom of the oxide layer and adsorption layer can be bonded. Thus, covalent bonding for the substrates, which are to be base materials, can be formed after the heat treatment process, and discontinuity at the bonded interface between the support substrate and single-crystalline layer can be eliminated.

(Feature 4) As thickness of the amorphous layers increases, ability to fill spaces formed between contact surfaces of the first and second amorphous layers can be improved. Meanwhile, as thickness of the amorphous layers increases, the thermal budget required for recrystallization of the amorphous layers increases. The manufacturing method for a semiconductor substrate described above may further comprise an amorphous layer thickness determination process in which the thicknesses of the first amorphous layer and the thickness of the second amorphous layer are determined depending on surface roughness of the support substrate and surface roughness of the single-crystalline layer. The amorphous layer formation process may include forming the first amorphous layer and the second amorphous layer having the respective thicknesses determined in the thickness determination process. Thus, the thickness of the first and second amorphous layers can appropriately be controlled in order to fill spaces formed in the contact surfaces. Thus, a thermal budget increase can be inhibited.

(Feature 5) In the manufacturing method for a semiconductor substrate described above, the thickness of the first amorphous layer may be in a range of 1 to 20 times greater than arithmetic average roughness of the surface of the support substrate. The thickness of the second amorphous layer may be in a range of 1 to 20 times greater than arithmetic average roughness of the surface of the single-crystalline layer. Thus, fluidity of atoms forming the first and second amorphous layers can be ensured.

(Feature 6) In the manufacturing method for a semiconductor substrate described above may further comprise a planarizing process in which a minute amount of chips are mechanically removed from the surface of the support substrate. The amorphous layer formation process may include forming the first amorphous layer by modifying the surface planarized by the planarizing process. Thus, the need to apply a polishing process, such as CMP (Chemical Mechanical Polishing), to the surface of the support substrate can be obviated, making it possible to reduce manufacturing cost of the semiconductor substrate.

(Feature 7) A semiconductor substrate may comprise: a first layer formed from polycrystalline SiC; and a second layer formed from single-crystalline SiC. An oxide layer present at the bonded interface between the first layer and the second layer may have a thickness of less than one atomic layer. Alternatively, density of oxygen atoms present at the interface between the first and second layers may be less than 1.2 E15 $cm^{-2}$, which is the atomic density of each SiC surface.

Embodiment

<Configuration of Bonded Substrate>

Figure 2:
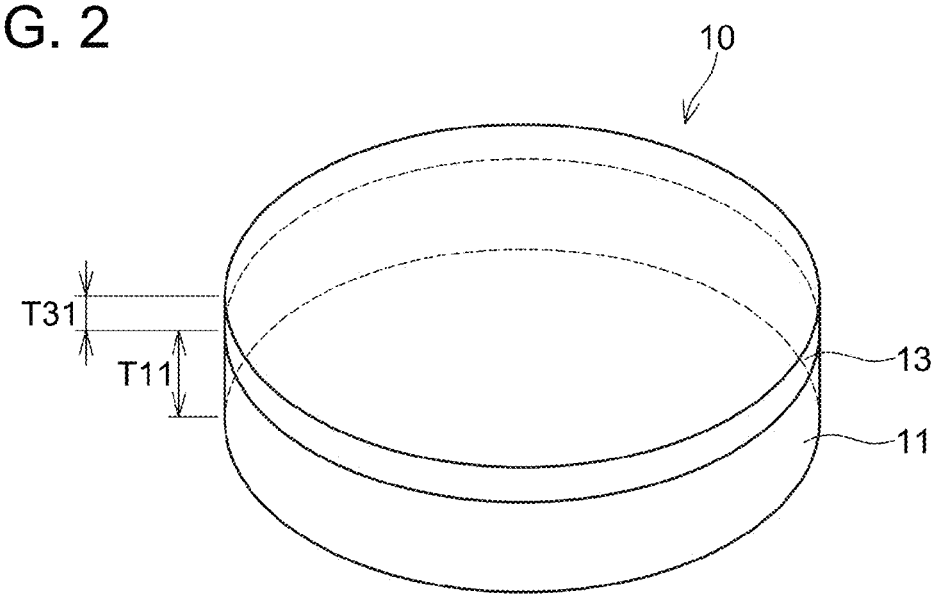
FIG. 2 is a perspective view of the bonded substrate.

FIG. 2 is a perspective view of a bonded substrate 10 according to the present embodiment. The bonded substrate 10 has an approximately disc-like shape. The bonded substrate 10 includes a support substrate 11 disposed on the underside, and a semiconductor layer 13 bonded to the upper surface of the support substrate 11. The semiconductor layer 13 may be formed from, for example, single crystals of a compound semiconductor (e.g., 6H—SiC, 4H—SiC, GaN, AlN). Alternatively, it may be formed from single crystals of a mono-element semiconductor (e.g., Si, C).

For the support substrate 11, various materials can be used. It is preferable that the support substrate 11 is resistant to various thermal processes applied to the semiconductor layer 13. Additionally, it is preferable that the support substrate 11 is formed from a material with a small difference in thermal expansion coefficient between the semiconductor layer 13 and this substrate 11. For example, if SiC is used for the semiconductor layer 13, single-crystalline SiC, polycrystalline SiC, single-crystalline Si, polycrystalline Si, sapphire, GaN, carbon, or the like can be used for the support substrate 11. In the polycrystalline SiC, various poly-types of SiC crystal may be mixed. Polycrystalline SiC in which various poly-types are mixed can be manufactured without severe temperature control, thus it can be enable a reduction in the manufacturing cost of the support substrate 11. Thickness T11 of the support substrate 11 needs to be set so as to obtain mechanical strength, which is able to withstand post-processing of semiconductor device manufacturing. For example, if the diameter of the support substrate 11 is 100 (mm), the thickness T11 may be about 100 (μm).

<Manufacturing Method for Bonded Substrate>

A manufacturing method for the bonded substrate 10 according to the present embodiment will be described using the flowchart in FIG. 1 and schematic views in FIGS. 3 to 8. FIGS. 3 to 8 are partial sectional views in corresponding processes for manufacturing the bonded substrate 10. In FIGS. 3 to 8, hatching is omitted for ease of viewing. In the present embodiment, a description is given using an example in which the support substrate 11 is formed from polycrystalline SiC and the semiconductor layer 13 is formed from single-crystalline SiC. Additionally, a description is given for a case where, in order to form the semiconductor layer 13, a delaminating technique (called Smart Cut (registered trademark)) by hydrogen atom ablation is used.

Figure 3:
FIG. 3 is an explanatory view of the manufacturing method for the bonded substrate.

First, a support substrate 11 and a SiC single-crystalline substrate 20, which are shown in FIG. 3, are prepared. In step S0, a planarizing process is carried out. In the planarizing process, the surface 11a of the support substrate 11 is planarized. The surface 11a of the support substrate 11 is planarized by mechanical polishing such as grinding, machining or lapping. In grinding or machining, planarizing is carried out by mechanically removing a minute amount of chips. The surface planarized by grinding or machining is rougher than a surface planarized by a polishing method such as CMP. Additionally, although the roughness of the surface planarized by mechanical polishing can be sufficiently decreased, a damaged layer of several nm remains. However, as described below, in the method described herein, even if the surfaces to be bonded are rough, their bonding is enabled. Therefore, surfaces subjected to grinding or machining can be used as surfaces to be bonded. Even if a damaged layer remains, the area forms an amorphous layer as described below. Therefore, a surface subjected to mechanical polishing can be used as a surface to be bonded.

Additionally, although the support substrate 11 is formed from polycrystalline SiC, it is difficult to planarize the polycrystalline SiC by CMP. This is because, in polycrystalline SiC, various plane orientations are exposed on the surface. In the case of carrying out CMP, since etching speed changes depending on plane orientation, the surface is significantly affected by crystal grain, and surface flatness is reduced. However, in the method described herein, even if the surface roughness of surfaces to be boned is increased by CMP, bonding is enabled. Additionally, even if a damaged layer of about several nm remains, bonding is enabled. Therefore, mechanical polishing using, for example, a free abrasive grain, such as diamond, which is small in plane-orientation dependence of polishing speed, can also be used for planarizing the polycrystalline SiC substrate.

Figure 4:
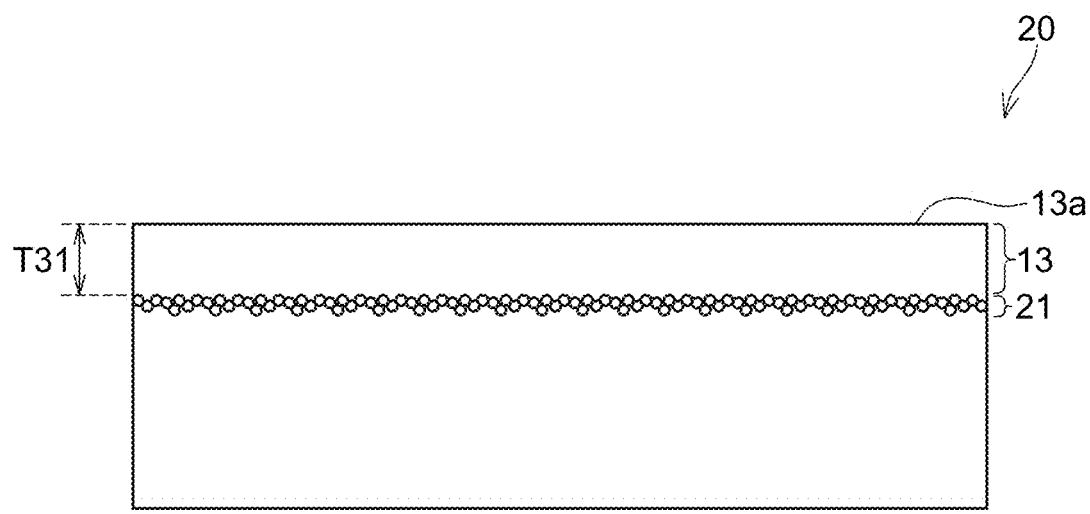
FIG. 4 is an explanatory view of the manufacturing method for the bonded substrate.

Additionally, in the planarizing process, the surface 13a of the SiC single-crystalline substrate 20 is planarized. The surface 13a may be planarized by grinding or machining, or may be planarized by the CMP method. The SiC single-crystalline substrate 20 can be planarized by CMP since no crystal grains of different orientations are present within the substrate surface. Then, an ion implantation process is carried out, in which hydrogen ions are implanted through the planarized surface 13a. Thus, as shown in the schematic view in FIG. 4, a hydrogen-ion-implanted layer 21 is formed at a predetermined depth below the surface 13a. In FIG. 4, implanted hydrogen ions are shown by empty circles. The thickness T31 of a semiconductor layer 13 stripped by a delaminating technique using hydrogen-atom ablation is controlled by the energy of hydrogen ions implanted. The thickness T31 may be in a range of 0.5 to 1.0 (μm). An implantation method of hydrogen ions may be a known one and, therefore, the description thereof will be omitted.

In step S1, an amorphous layer thickness determination process is carried out. The amorphous layer thickness determination process is a process in which the thickness T11 of the amorphous layer 11b of the support substrate 11 and the thickness T13 of the amorphous layer 13b of the SiC single-crystalline substrate 20 are determined depending on the surface roughness of the support substrate and the surface roughness of a single-crystalline layer.

Now, the amorphous layer thickness determination process will be described in detail. First, the surface roughness of the surface 11a of the support substrate 11 and the surface roughness of the surface 13a of the semiconductor layer 13 are measured. For surface roughness, various indexes, such as arithmetic average roughness Ra, PV (Peak to Valley) value, which is the height difference within a concavo-convex of the surface, and the smallest root mean square roughness RMS, may be used. In the present description, the arithmetic average roughness Ra is used. For the measurement of surface roughness, various systems may be used. For example, a probe system, a laser sensor system, an optical interference system, or the like may be used. A scanning probe microscope (SPM) may also be used for measurement of surface roughness.

Next, on the basis of the surface roughness thus measured, the thicknesses T11 and T13 are determined. In the present embodiment, the thickness T11 is determined within a range of 1 to 20 times greater than the arithmetic average roughness Ra11 of the surface 11a. In the present embodiment, the thickness T13 is determined within a range of 1 to 20 times greater than the arithmetic average roughness Ra13 of the surface 13a. For example, in the present embodiment, an amorphous layer with a thickness of about 2 nm is formed with respect to a surface roughness of Ra=1 nm. If PV values are used for the surface roughness, the thickness T11 is determined within a range of 1 to 2 times greater than the PV value of the surface 11a. Additionally, the thickness T13 is determined within a range of 1 to 2 times greater than the PV value of the surface 13a. For example, in the present embodiment, an amorphous layer with a thickness of about 2 nm is formed with respect to a surface roughness of PV value=1.5 nm.

In step S2, an amorphous layer formation process is carried out. The amorphous layer formation process is a process in which an amorphous layer 11b is formed by modifying the surface of the support substrate 11 and an amorphous layer 13b is formed by modifying the surface of a semiconductor layer 13. The amorphous layer refers to a layer in which atoms have no regularity, unlike a crystalline structure. The amorphous layers 11b and 13b are set to the thicknesses determined in the amorphous layer thickness determination process (step S1).

Figure 5:
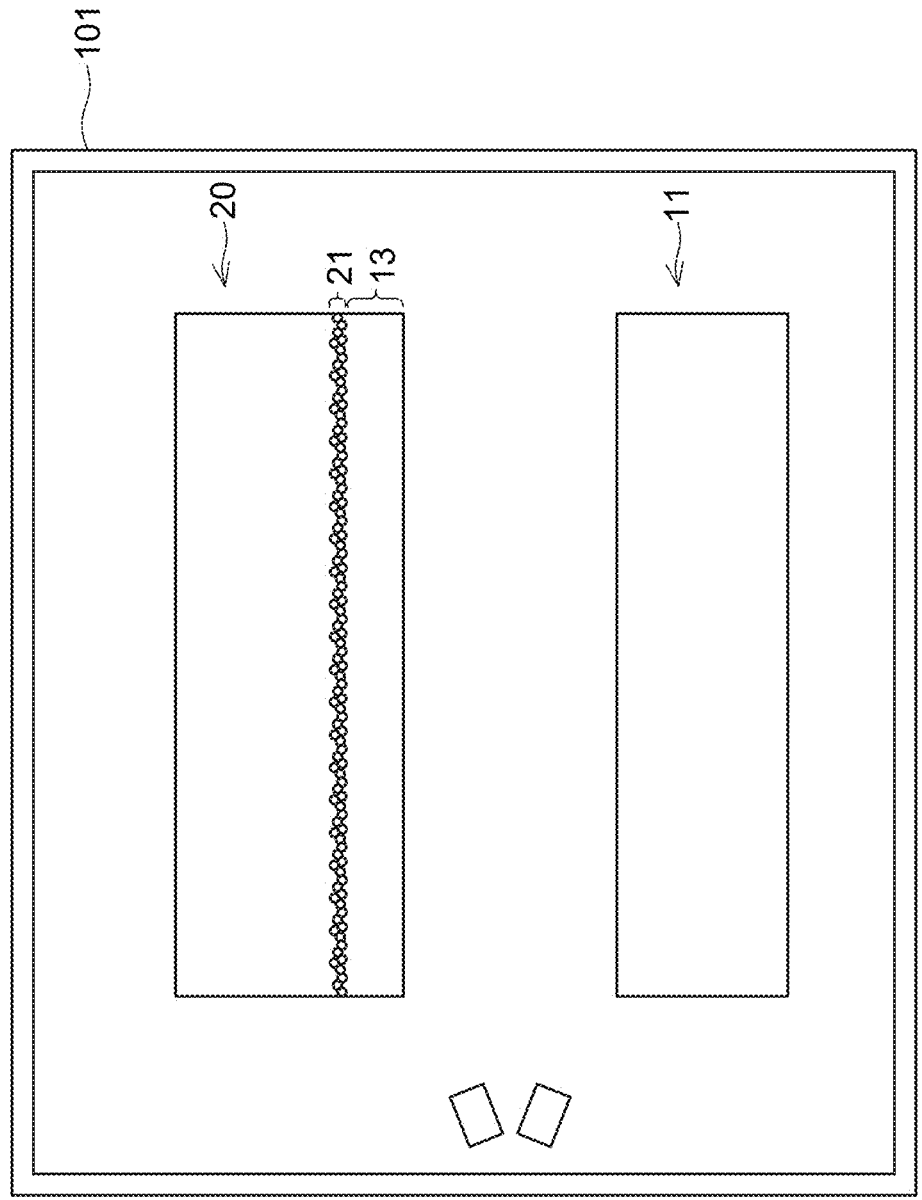
FIG. 5 is an explanatory view of the manufacturing method for the bonded substrate.

Now, the amorphous layer formation process will be described in detail. As shown in FIG. 5, the SiC single-crystalline substrate 20 and support substrate 11 are set in a chamber 101. Subsequently, the SiC single-crystalline substrate 20 and support substrate 11 are aligned with each other Alignment is carried out so that both substrates come into contact with each other in a correct positional relation in a contact process, which is described below. Next, the inside of the chamber 101 is brought into a vacuum state. The degree of vacuum in the chamber 101 may be about $1 \times 10^{-4}$ to $1 \times 10^{-6}$ (Pa).

Figure 6:
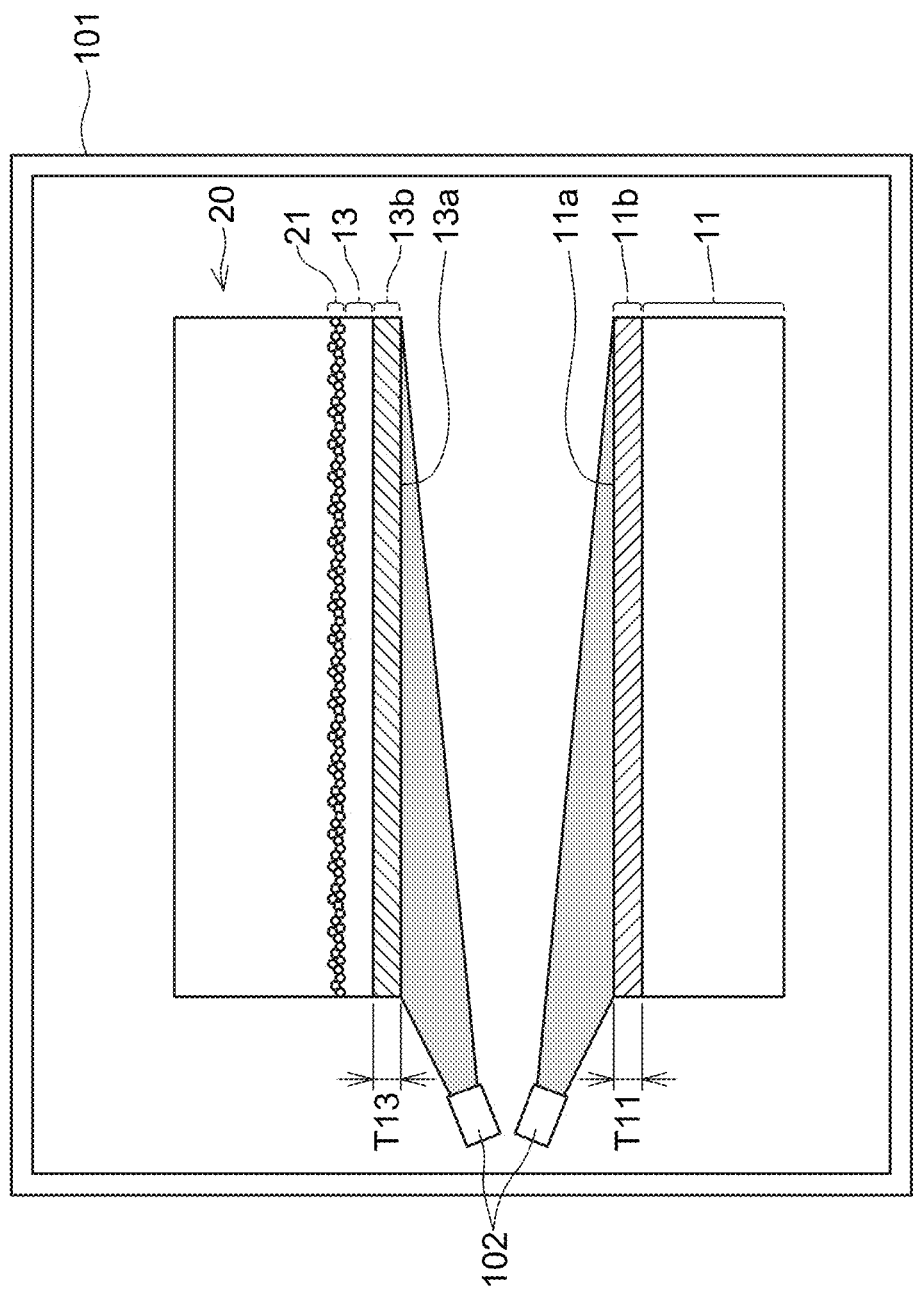
FIG. 6 is an explanatory view of the manufacturing method for the bonded substrate.

As shown in FIG. 6, an argon neutral atom beam is irradiated to the surface 11a of the support substrate 11 and the surface 13a of the semiconductor layer 13 by using a Fast Atom Beam (FAB) gun 102. Thus, the crystalline structures of the surfaces 11a and 13a can be destroyed at their respective fixed depths below the surfaces. As a result, amorphous layers 11b and 13b containing Si and C can be formed on the substrate surface. Additionally, the amorphous layers 11b and 13b can be formed such that the content ratio of Si to C is 1:1. Thus, when the amorphous layers 11b and 13b are recrystallized, a SiC crystal can be formed. In FIG. 6, amorphous layers 11b and 13b are shown by hatching. The thickness T11 of the amorphous layer 11b and the thickness T13 of the amorphous layer 13b can be controlled by the energy of argon atoms irradiated from the FAB gun 102. The amount of argon irradiated (atoms/cm2) may be calculated using the thickness of the amorphous layer to be formed and a sputtering rate. Incident energy may be, for example, about 1.5 (keV).

Additionally, in the amorphous layer formation process, bonds can be exposed by the removal of the oxide layers of the surfaces 11a and 13a and an adsorption layer and, therefore, the surfaces 11a and 13a can be activated. In addition, since the amorphous layer formation process is a process performed in a vacuum, the surfaces 11a and 13a can be kept activated without being, for example, oxidized.

Figure 7:
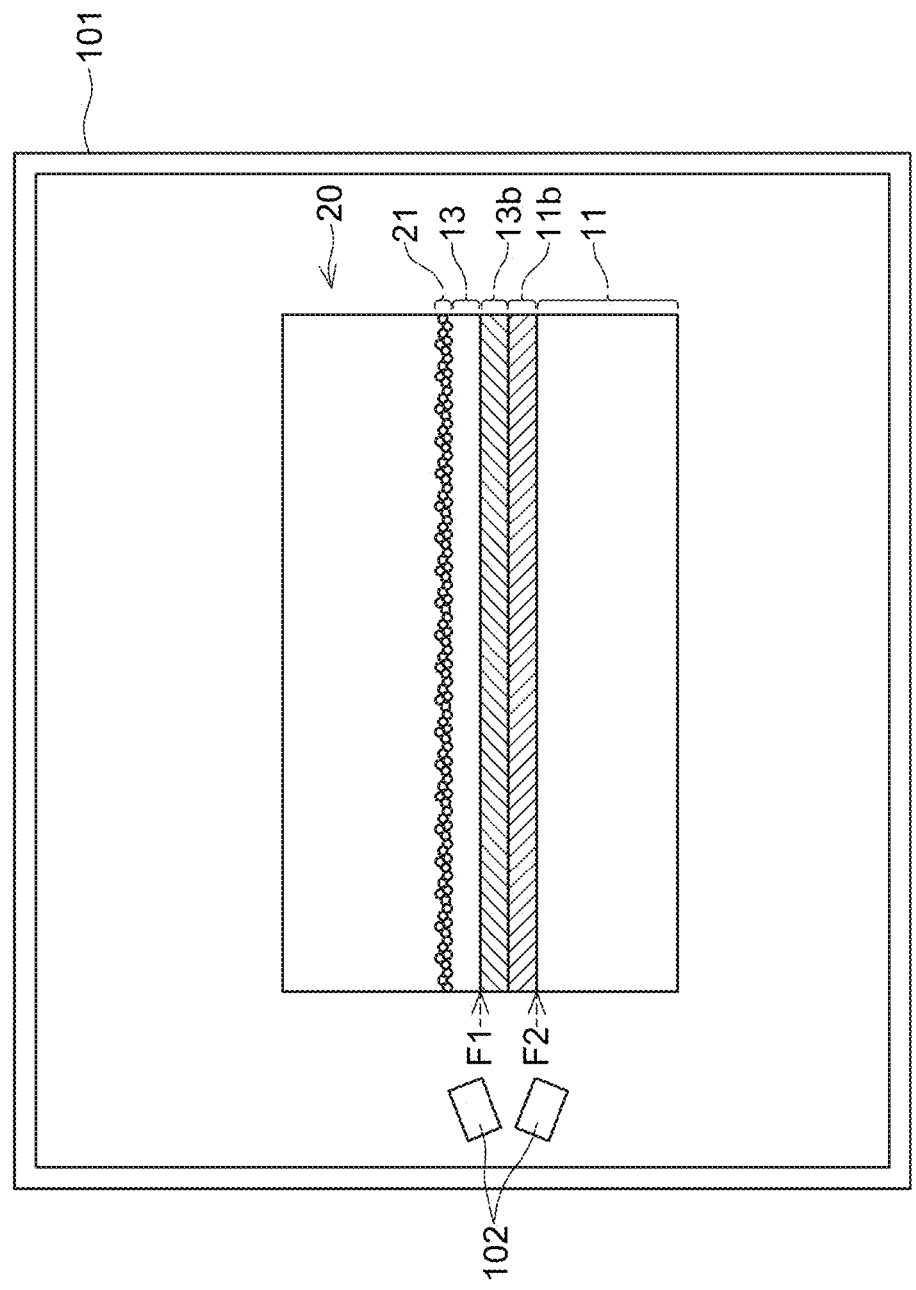
FIG. 7 is an explanatory view of the manufacturing method for the bonded substrate.

In step S3, the contact process is carried out. In the contact process, as shown in FIG. 7, the amorphous layer 11b of the support substrate 11 and the amorphous layer 13b of the SiC single-crystalline substrate 20 are brought into contact with each other in a vacuum in the chamber 101. The support substrate 11 and SiC single-crystalline substrate 20 may be fixed by a jig or the like, not shown, so as not to separate from each other after contact.

In step S4, a heat treatment process is carried out. In the heat treatment process, the support substrate 11 and SiC single-crystalline substrate 20 are heat-treated, with the amorphous layers 11b and 13b being in contact with each other. The heat treatment process may be carried out under reduced pressure in the chamber 101 or may be carried out in a furnace other than the chamber 101.

In the heat treatment process, the support substrate 11 and SiC single-crystalline substrate 20 are heated to predetermined temperatures (e.g., about 1000 degrees Celsius). Thus, the amorphous layers 11b and 13b are rendered fluid. There is a case where a space is formed between the contact surfaces of the amorphous layers 11b and 13b. The greater the surface roughness of the amorphous layers 11b and 13b, the larger the volume of the space formed. However, the heat treatment process can cause atoms forming the amorphous layers 11b and 13b to flow, making it possible to fill the space formed between the contact surfaces of the amorphous layers 11b and 13b. Additionally, the SiC single-crystalline substrate 20 can be broken in the hydrogen-ion-implanted layer 21 by the heat treatment process. Accordingly, the SiC single-crystalline substrate 20 located above the semiconductor layer 13 can be removed.

Figure 8:
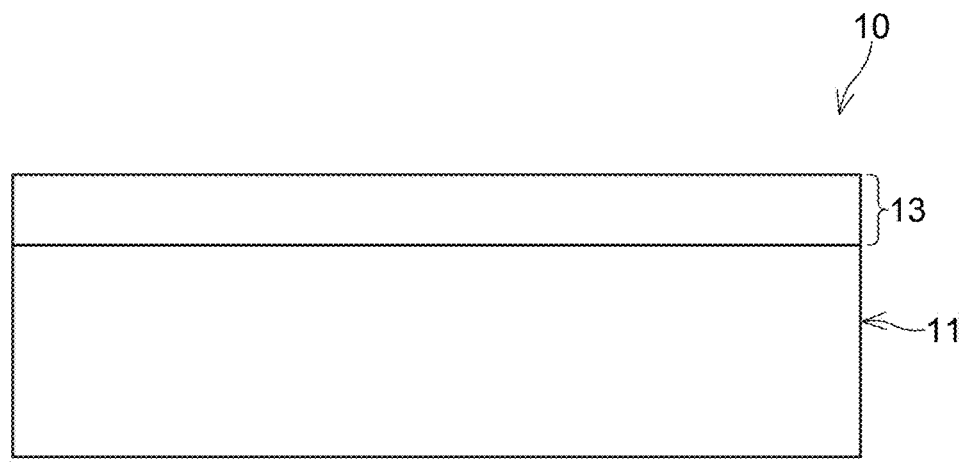
FIG. 8 is an explanatory view of the manufacturing method for the bonded substrate.

Additionally, by virtue of the heat treatment process, the amorphous layers 11b and 13b can be recrystallized, from a state in which the atomic arrangement has no regularity to a state in which the atomic arrangement has a regularity. The recrystallization of the amorphous layer 13b is carried out such that atoms are arranged following the crystalline structure (single-crystalline SiC) of the semiconductor layer 13, from the interface F1 (see FIG. 7) between the amorphous layer 13b and semiconductor layer 13 toward the inside (the lower side in FIG. 7) of the semiconductor layer 13b. The recrystallization of the amorphous layer 11b is carried out such that atoms are arranged following the crystalline structure (polycrystalline SiC) of the support substrate 11, from the interface F2 (see FIG. 7) between the amorphous layer 11b and support substrate 11 toward the inside (the upper side in FIG. 7) of the amorphous layer 11b. Therefore, when recrystallization is complete, a bonded substrate 10 is formed, in which, as shown in FIG. 8, with amorphous layers 11b and 13b eliminated, the semiconductor layer 13 and support substrate 11 are directly bonded. Since the amorphous layers 11b and 13b are integrally recrystallized, the semiconductor layer 13 and support substrate 11 can be firmly bonded by covalent bonding.

<Analysis by TEM Image (Part 1)>

Figure 9:
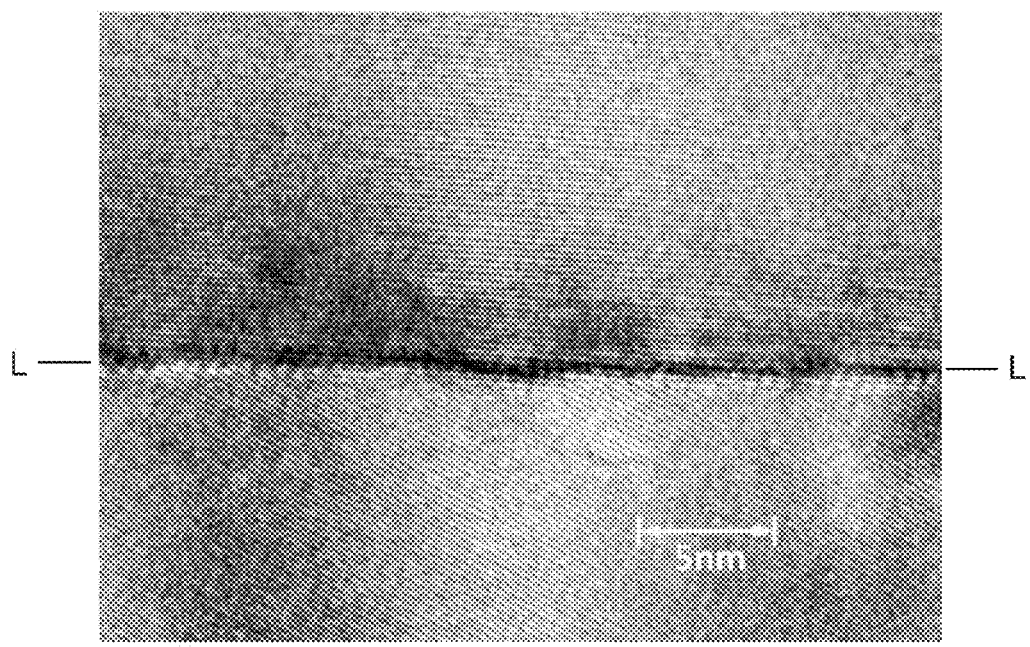
FIG. 9 is a TEM image of a bonded interface.

FIG. 9 shows a TEM (Transmission Electron Microscope) photograph of a bonded interface between the support substrate 11 and semiconductor layer 13 of the bonded substrate 10 formed by the bonding method described herein. In the bonded substrate 10 used for the observation, the support substrate 11 is formed from polycrystalline SiC and the semiconductor layer 13 is formed from single-crystalline 4H—SiC. In the amorphous layer formation process, argon atoms were irradiated with incidence energy of 1.5 (keV) for 60 (sec). In the beat treatment process, the highest temperature is 1100 degrees Celsius.

In the TEM photograph in FIG. 9, a TEM sample thinned by ion milling is observed. In FIG. 9, the area below the L-L line as a boundary line is the support substrate 11 (polycrystalline SiC) and the area above it is the semiconductor layer 13 (single-crystalline SiC). In the area of the bonded interface indicated by the L-L line in FIG. 9, an atomic periodicity can be observed over the entire area of the bonded interface. Accordingly, it is found that there is no amorphous layer at the interface. Additionally, it is found that no unnecessary intermediate layer is present and a polycrystalline SiC and a single-crystalline SiC are in direct contact with each other at an atomic level. In addition, as a result of the oxygen concentration analysis of this bonded substrate by SIMS (Secondary Ion-microprobe Mass Spectrometry), the density of oxygen atoms present at the interface between the support substrate 11 and semiconductor layer 13 is 2.2 E14 $cm^{-2}$. This value is lower than 1.2 E15 $cm^{-2}$, which is the atomic density of the SiC surface. From this, it is found that the thickness of an oxide layer present at the bonded interface formed by the technique disclosed herein, is less than one atomic layer. It is noted that there is a case where an amorphous layer is present in part of the bonded interface between the support substrate 11 and semiconductor layer 13. This is because atoms forming the amorphous layers 11b and 13b flow and fill spaces between the contact surfaces of the amorphous layers 11b and 13b, resulting in unfixed thickness of the amorphous layer to be recrystallized. Additionally, it should be noted that an oxide layer equal to or thicker than one atomic layer may be present in part of the bonded interface between the support substrate 11 and semiconductor layer 13.

A direct bonding method and a room-temperature bonding method known from hitherto are not able to obtain a TEM image showing the direct bonding of polycrystalline SiC and single-crystalline SiC at an atomic level and also showing the periodicity of atoms over the entire area of the bonded interface. This is because, in the direct bonding method in which bonding takes place under atmospheric pressure, an oxide layer and an adsorption layer are present at the bonded interface. This is also because, in the room-temperature bonding method, the atomic arrangement at the bonded interface is disturbed during surface activation using an ion gun in a vacuum and the atomic arrangement cannot be corrected in the subsequent processes. In other words, it is possible to determine from a TEM image of the bonded interface, whether the bonded substrate has been formed using the bonding method described herein or not.

<Analysis of Surface Roughness and Bonding Strength>

Figure 10:
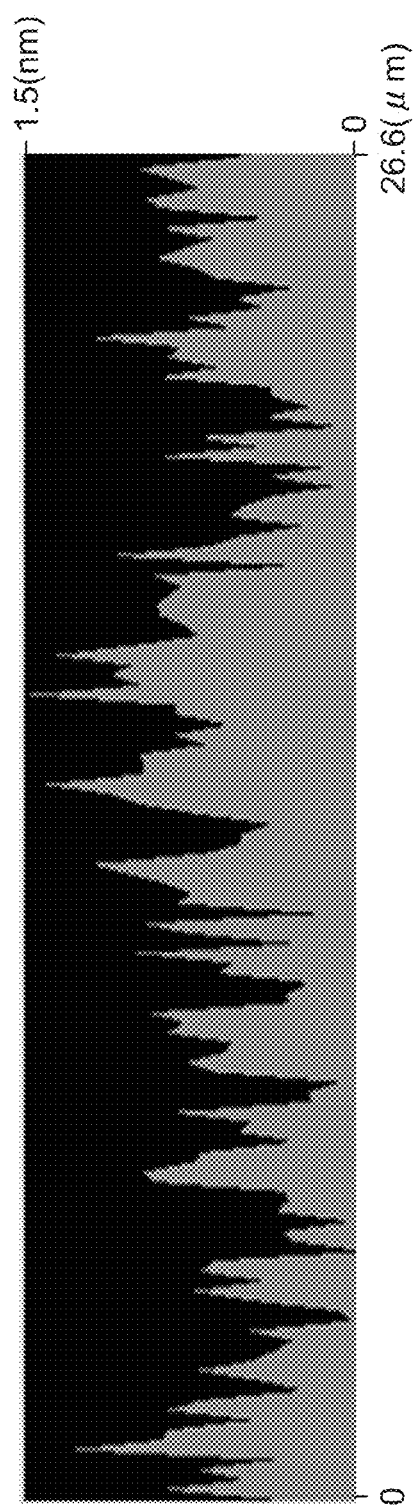
FIG. 10 is a surface roughness analysis data graph.

FIG. 10 shows the analysis data of the surface roughness in the planarizing process (step S0) carried out when the bonded substrate 10, analyzed as shown in FIG. 9, is manufactured. A measured target is the surface of the support substrate 11 planarized by the CMP. Namely, FIG. 10 shows the profile of a cross-section of the surface of the support substrate 11. A measurement instrument is an Atomic Force Microscope (AFM) apparatus (model numbers SPA500 & SPI3800) by Hitachi High-Tech Science Corporation (registered trademark). The horizontal axis indicates a measuring range and is about 27 μm. The PV value of the support substrate 11 in the measuring range shown in FIG. 10 is 1.5 nm and the arithmetic average roughness thereof is Ra=1 nm. This surface is too rough to allow for the conventional direct bonding method.

Additionally, a bonded substrate is formed using a sample that has been subjected to the surface roughness measurement, and a tension test is carried out. Even when 20 (MPa), which is the upper limit for the instrument, is applied, the bonded surfaces do not separate from each other. Thus, it is found that, even in a case where the surfaces to be bonded are too rough to allow for bonding in the conventional direct bonding method, the bonding method described herein enables the surfaces to be bonded at bonding strength sufficient to withstand semiconductor processing or the like.

Advantageous Effects

In a so-called direct bonding technique, in which a support substrate and the single-crystalline layer of a semiconductor are directly bonded without an intermediate material such as resin or alloy, they are bonded by means of attracting force between the surfaces. Therefore, the surfaces to be bonded have to be brought as close as less than several nm between them, which may require the surface roughness of the surfaces to be bonded, to be very small (for example, an arithmetic average roughness Ra of 0.3 (nm) may be required). Additionally, in order that the surface roughness of the surfaces to be bonded are enabled to increase to a certain degree, a method for rendering the SiC crystals of the surfaces to be bonded fluid may be considered. However, since SiC crystals have the property of sublimating at a temperature beyond 2000 degrees Celsius (i.e., the SiC crystals directly vaporize from a solid state), they do not liquefy by melting. Therefore, it is difficult to render the SiC crystals fluid.

Meanwhile, in the bonding method described herein, the surfaces to be bonded are modified to amorphous layers 11b and 13b containing Si and C. In the amorphous layers, atoms with dangling bonds are present. Therefore, the fluidity of atoms can be enhanced, compared to a crystal layer in which no dangling bonds are present. That is, the amorphous layers 11b and 13b can be rendered fluid at temperatures of about 1000 degrees Celsius or below, which are sufficiently lower than the sublimation temperature (about 2500 degrees Celsius) of SiC crystals. Accordingly, while sublimation is prevented, a material forming a surface to be bonded can be rendered fluid. Thus, after atoms forming the amorphous layers 11b and 13b flow and fill spaces between the contact surfaces of the amorphous layers 11b and 13b, the amorphous layers 11b and 13b can be recrystallized. That is, in the foregoing method, bonding does not require attracting force between the surfaces; therefore, even in a case where the surfaces to be bonded are rougher than those required in the direct bonding method, the substrates can be bonded with a bonding strength sufficient to withstand semiconductor processing and so on.

The bonding method described herein makes it possible to bond substrates even if the surfaces to be bonded are rougher than those in the direct bonding method or the like. Accordingly, in the planarizing process (step S0), the surface 11a of the support substrate 11, which is a surface to be bonded, can be planarized by grinding or machining. Thus, the need to apply a polishing process, such as CMP (Chemical Mechanical Polishing), to the surface of the support substrate 11 can be obviated, making it possible to reduce the manufacturing cost of a semiconductor substrate.

As the thickness T11 of the amorphous layer 11b and the thickness T13 of the amorphous layer 13b increase, the fluidity of the amorphous layers 11b and 13b can be enhanced, thus improving the ability to fill spaces formed between the contact surfaces of the amorphous layers 11b and 13b. Meanwhile, as the thicknesses T11 and T13 increase, the thermal budget required for recrystallization of the amorphous layers 11b and 13b increase. The bonding method described herein makes it possible to determine the thicknesses T11 and T13 depending on the surface roughness of the support substrate 11 and the surface roughness of the semiconductor layer 13 in the amorphous layer thickness determination process (step S1). Thus, the thicknesses T11 and T13 can appropriately be controlled in order to fill spaces formed between the contact surfaces of the surfaces 11a and 13a. Thus, a thermal budget increase can be inhibited.

In the contact process (step S3), since the surface 11a and surface 13a, from which the oxide layer and adsorption layer are removed in the amorphous layer formation process (step S2), can be brought into contact with each other in a vacuum, these clean surfaces can be bonded. Thus, it is possible to form a structure in which polycrystalline SiC and single-crystalline SiC are directly bonded at an atomic level without an unnecessary intermediate layer, as shown by the TEM photograph in FIG. 9. Even in a case where an electric current path is formed so as to intersect an interface between the support substrate 11 and semiconductor layer 13 when a vertical device is formed using the bonded substrate 10, a device performance decrease (e.g., an on-resistance increase) due to the presence of the interface can be prevented. The bonding method described herein makes it possible to manufacture the bonded substrate 10 suitable for the manufacture of a vertical device.

Direct bonding of the support substrate 11I and the semiconductor layer 13 causes atomic arrangement displacement in the bonded surfaces, and this displacement cannot be relaxed, resulting in stress. Meanwhile, the bonding method described herein has a configuration in which the support substrate 11 and the semiconductor layer 13 are bonded via the amorphous layers 11b and 13b. In the heat treatment process, the Si atoms and C atoms in the amorphous layers 11b and 13b are gradually moved by thermal energy and recrystallized. By virtue of this, even if displacement arises between the atomic arrangement of the semiconductor 13 at the interface F1 (see FIG. 7) between the amorphous layer 13b and the semiconductor layer 13, and the atomic arrangement of the support substrate 11 at the interface F2 (see FIG. 7) between the amorphous layer 11b and the support substrate 11, the amorphous layers 11b and 13b interposed between the interfaces F1 and F2 are recrystallized so as to mitigate the displacement between them. That is, the amorphous layers 11b and 13b can be utilized as stress relaxing layers, which can be eliminated by the heat treatment process. As described above, internal stress caused at the interface between the support substrate 11 and semiconductor layer 13 can be relaxed; therefore, in the semiconductor layer 13 above the support substrate 11 also, internal stress is relaxed. Accordingly, the heat treatment process can relax internal stress in the semiconductor layer 13 as well as move and rearrange defects within the semiconductor layer 13, thus reducing the density of various defects present in the semiconductor layer 13 generating from internal stress.

In a case where the support substrate 11 and semiconductor layer 13 are directly bonded without forming amorphous layers 11b and 13b, significant stress may arise in the bonded substrate. This is because the support substrate 11 is formed from polycrystalline SiC and various plane orientations are exposed on the surface of the support substrate 11, and coefficients of thermal expansion slightly differ according to the plane orientations. The bonding method described herein has the configuration in which the support substrate 11 and semiconductor layer 13 are bonded via the amorphous layers 11b and 13b. In heat treatment after bonding, even if internal stress arises due to differences between the coefficients of thermal expansion corresponding to plane orientations, the amorphous layers 11b and 13b are recrystallized while gradually flowing so as to relax this internal stress. Accordingly, internal stress arising at the interface between the support substrate 11 and semiconductor layer 13 can be relaxed.

In the bonding method described herein, the amorphous layers 11b and 13b can be interposed between the support substrate 11 and the semiconductor layer 13. These amorphous layers 11b and 13b can prevent various defects exposed on the surface of the support substrate 11 from affecting the semiconductor layer 13. That is, it is possible to prevent, when the atoms of the semiconductor layer 13 are rearranged in the heat treatment process, a situation in which the semiconductor layer 13 after rearrangement is affected by various defects present on the surface of the support substrate 11, and defects are also formed in the semiconductor layer 13. Accordingly, the density of defects in the semiconductor layer 13 can be reduced.

While specific embodiments of the present invention have been described in detail above, such description is for illustrative purposes only and is not intended to limit the scope and claims of the invention. Techniques described in the claims of the invention include various modifications and changes made to the specific examples illustrated above.

Modified Example

In the amorphous layer formation process (step S2), the method for forming an amorphous layer is not limited to irradiating an argon neutral atom beam. For example, a method for injecting atoms, molecules, ions, or the like such as He, H, Ar, and C may be employed.

In the heat treatment process (step S4), an aspect of a temperature change with a processing time may be varied.

The material used in the support substrate 11 is not limited to polycrystalline SiC. Any material that withstands various heat processes applied to the semiconductor layer 13 suffices. For example, a sintered body formed of a mixture of ceramic materials also suffices. The ceramic materials to be used may be varied. At least one material selected from, for example, SiC, Si, AlN, $Al_2O_3$, GaN, $Si_3N_4$, $SiO_2$, $Ta_2O_5$ and so on, may be used.

Furthermore, it is to be understood that the technical elements described in the present specification and the drawings exhibit technical usefulness solely or in various combinations thereof and shall not be limited to the combinations described in the claims at the time of filing. The techniques illustrated in the present specification and the drawings are to achieve a plurality of objectives at the same time, and technical usefulness is exhibited by attaining any one of such objectives.

The invention claimed is:

1. A manufacturing method for a semiconductor substrate, the method comprising:
   mechanically polishing a surface of a support substrate to planarize the surface,
   forming a first amorphous layer by destroying crystalline structures of the planarized surface of the support substrate and a second amorphous layer by destroying a crystalline structures of a surface of a single-crystalline layer of a semiconductor;
   bringing the first amorphous layer and second amorphous layer into contact with each other; and
   conducting a heat treatment to the support substrate and single-crystalline layer with while the first amorphous layer and the second amorphous layer being in contact with each other,
   wherein a thickness of the first amorphous layer and a thickness of the second
   amorphous layer is made larger as surface roughness of the support substrate and surface roughness of the single-crystalline layer becomes greater to increase fluidity of the first amorphous layer and the second amorphous layer to fill spaces formed between the first amorphous layer and the second amorphous layer.

2. The manufacturing method for a semiconductor substrate according to claim 1, wherein
   the single-crystalline layer is formed from single-crystalline SiC, and
   the support substrate is formed from polycrystalline SiC.

3. The manufacturing method for a semiconductor substrate according to claim 2, wherein the first amorphous layer and the second amorphous layer contain Si and C.

4. The manufacturing method for a semiconductor substrate according to claim 1, wherein the forming of the first amorphous layer and the second amorphous layer includes irradiating atomic-level particles in a vacuum, and
the bringing of the first amorphous layer and the second amorphous layer into contact is carried out subsequent to the forming of the first amorphous layer and the second amorphous layer.

5. A manufacturing method for a semiconductor substrate, the method comprising:
mechanically polishing a surface of a support substrate to planarize the surface,
determining a thickness of a first amorphous layer and a thickness of a second amorphous layer depending on surface roughness of the support substrate and surface roughness of a single-crystalline layer of a semiconductor to increase fluidity of the first amorphous layer and the second amorphous layer to fill spaces formed between the first amorphous layer and the second amorphous layer;
forming the first amorphous layer having the determined thickness by destroying a crystalline structures of the planarized surface of the support substrate and the second amorphous layer having the determined thickness by destroying a crystalline structures of a surface of the single-crystalline layer of the semiconductor;
bringing the first amorphous layer and second amorphous layer into contact with each other; and
conducting a heat treatment to the support substrate and single-crystalline layer while the first amorphous layer and the second amorphous layer being in contact with each other.

6. The manufacturing method for a semiconductor substrate according to claim 5, wherein
the single-crystalline layer is formed from single-crystalline SiC, and
the support substrate is formed from polycrystalline SiC.

7. The manufacturing method for a semiconductor substrate according to claim 6, wherein the first amorphous layer and the second amorphous layer contain Si and C.

8. The manufacturing method for a semiconductor substrate according to claim 5, wherein the forming of the first amorphous layer and the second amorphous layer includes irradiating atomic-level particles in a vacuum, and
the bringing of the first amorphous layer and the second amorphous layer into contact is carried out subsequent to the forming of the first amorphous layer and the second amorphous layer.

9. A manufacturing method for a semiconductor substrate, the method comprising:
mechanically polishing a surface of a support substrate to planarize the surface,
determining that: a thickness of a first amorphous layer is in a range of 1 to 20 times greater than arithmetic average roughness of the surface of the support substrate; and a thickness of a second amorphous layer is in a range of 1 to 20 times greater than arithmetic average roughness of the surface of a single-crystalline layer of a semiconductor to increase fluidity of the first amorphous layer and the second amorphous layer to fill spaces formed between the first amorphous layer and the second amorphous layer;
forming the first amorphous layer having the determined thickness by destroying a crystalline structures of the planarized surface of the support substrate; and the second amorphous layer having the determined thickness by destroying a crystalline structures of a surface of the single-crystalline layer of the semiconductor;
bringing the first amorphous layer and second amorphous layer into contact with each other; and
conducting a heat treatment to the support substrate and single-crystalline layer while the first amorphous layer and the second amorphous layer being in contact with each other.

10. The manufacturing method for a semiconductor substrate according to claim 9, wherein
the single-crystalline layer is formed from single-crystalline SiC, and
the support substrate is formed from polycrystalline SiC.

11. The manufacturing method for a semiconductor substrate according to claim 10, wherein the first amorphous layer and the second amorphous layer contain Si and C.

12. The manufacturing method for a semiconductor substrate according to claim 9, wherein the forming of the first amorphous layer and the second amorphous layer includes irradiating atomic-level particles in a vacuum, and
the bringing of the first amorphous layer and the second amorphous layer into contact is carried out subsequent to the forming of the first amorphous layer and the second amorphous layer.

13. A manufacturing method for a semiconductor substrate, the method comprising:
mechanically polishing a surface of a support substrate to planarize the surface,
forming a first amorphous layer by destroying a crystalline structures of the planarized surface of the support substrate and a second amorphous layer by destroying a crystalline structures of a surface of a single-crystalline layer of a semiconductor to increase fluidity of the first amorphous layer and the second amorphous layer to fill spaces formed between the first amorphous layer and the second amorphous layer;
bringing the first amorphous layer and second amorphous layer into contact with each other; and
conducting a heat treatment to the support substrate and single-crystalline layer while the first amorphous layer and the second amorphous layer being in contact with each other,
wherein a thickness of the first amorphous layer is within a range of 1 to 2 times greater than a Peak to Valley value indicating a roughness of the surface of the support substrate, and
a thickness of the second amorphous layer is within a range of 1 to 2 times greater than a Peak to Valley value indicating a roughness of the surface of the single-crystalline layer.

14. The manufacturing method for a semiconductor substrate according to claim 13, wherein
the single-crystalline layer is formed from single-crystalline SiC, and
the support substrate is formed from polycrystalline SiC.

15. The manufacturing method for a semiconductor substrate according to claim 14, wherein the first amorphous layer and the second amorphous layer contain Si and C.

16. The manufacturing method for a semiconductor substrate according to claim 13, wherein the forming of the first amorphous layer and the second amorphous layer includes irradiating atomic-level particles in a vacuum, and
the bringing of the first amorphous layer and the second amorphous layer into contact is carried out subsequent to the forming of the first amorphous layer and the second amorphous layer.

* * * * *